United States Patent
Ishii et al.

(10) Patent No.: US 10,074,582 B2
(45) Date of Patent: Sep. 11, 2018

(54) SEALING SHEET

(71) Applicant: NITTO DENKO CORPORATION, Ibaraki-shi, Osaka (JP)

(72) Inventors: Jun Ishii, Ibaraki (JP); Goji Shiga, Ibaraki (JP); Chie Iino, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/507,923

(22) PCT Filed: Aug. 21, 2015

(86) PCT No.: PCT/JP2015/073544
§ 371 (c)(1),
(2) Date: Mar. 1, 2017

(87) PCT Pub. No.: WO2016/035577
PCT Pub. Date: Mar. 10, 2016

(65) Prior Publication Data
US 2017/0287800 A1   Oct. 5, 2017

(30) Foreign Application Priority Data
Sep. 3, 2014  (JP) .................................. 2014-179311

(51) Int. Cl.
*H01L 23/10* (2006.01)
*H01L 23/31* (2006.01)
*C09J 7/02* (2006.01)

(52) U.S. Cl.
CPC ........ *H01L 23/3142* (2013.01); *C09J 7/0239* (2013.01); *H01L 23/10* (2013.01); *H01L 2924/0002* (2013.01)

(58) Field of Classification Search
None
See application file for complete search history.

(56) References Cited

U.S. PATENT DOCUMENTS

2013/0078769 A1   3/2013   Oda et al.

FOREIGN PATENT DOCUMENTS

| JP | 2006-019714 | 1/2006 |
|----|----|----|
| JP | 2012-169501 | 9/2012 |
| JP | 2014-103257 | 6/2014 |
| JP | 2014-107397 | 6/2014 |
| JP | 2014-152302 | 8/2014 |
| JP | 2014159555 A * | 9/2014 |
| WO | WO 2014/115725 | 7/2014 |
| WO | WO 2014/1 261 5 | 8/2014 |

OTHER PUBLICATIONS

A machine-generated English translation of JP 2014159555A.*
(Continued)

*Primary Examiner* — Kimberly Rizkallah
*Assistant Examiner* — Bo Bin Jang
(74) *Attorney, Agent, or Firm* — Knobbe, Martens Olson & Bear, LLP

(57) ABSTRACT

Provided is a sealing sheet capable of preventing void and filler segregation from occurring when forming a sealing body in which semiconductor chips are buried in the sealing sheet. The sealing sheet has a viscosity within the range of 1 Pa·s to 50000 Pa·s at 90° C.

1 Claim, 4 Drawing Sheets

(56) References Cited

OTHER PUBLICATIONS

International Preliminary Report on Patentability, dated Mar. 7, 2017, in International Patent Application No. PCT/JP2015/073544.
Singaporean Office Action, dated Sep. 22, 2017, in corresponding Singaporean Patent Application No. 11201701446Y.
Japanese Office Action, dated Jan. 9, 2018, in corresponding Japanese Patent Application No. 2014-179311.
Extended Search Report, dated Aug. 30, 2017, issued in corresponding European Patent Application No. 15837854.7.
Technology Epoxy "EPO-TEK 920-FL Technical Data Sheet".

* cited by examiner (a)

(b)

SEALING SHEET

TECHNICAL FIELD

The present invention relates to a sealing sheet.

BACKGROUND ART

Hitherto, a production method for a semiconductor device has been known in which a sealing sheet is arranged onto one or more semiconductor chips fixed to, e.g., a substrate, and subsequently the workpiece is pressurized while heated, so as to bury the semiconductor chip(s) into the sealing sheet (see, for example, Patent Document 1).

PRIOR ART DOCUMENT

Patent Document

Patent Document 1: JP-A-2006-19714

SUMMARY OF THE INVENTION

Problems to be Solved by the Invention

In the above-mentioned semiconductor device production method, the sealing sheet flows so that the semiconductor chip(s) is/are buried into the sealing sheet. However, when the sealing sheet is short in fluidity, it is feared that voids or filler segregation is generated near the outer circumference of the sealed body.

In light of this problem, the present invention has been made, and an object thereof is to provide a sealing sheet about which at the time of forming a sealed body in which one or more semiconductor chips are buried, voids or filler segregation can be restrained from being generated in the sheet.

Means for Solving the Problems

The present inventors have found out that the above-mentioned problem can be solved by adopting a structure described below, and then accomplished the present invention.

Accordingly, the present invention is a sealing sheet having a viscosity at 90° C. that ranges from 1 to 50000 Pa·s.

In the sealing sheet according to the present invention, the viscosity of this sheet is 50000 Pa·s or less at 90° C.; thus, one or more semiconductor chips can be suitably buried into the sealing sheet. Moreover, the viscosity is 50000 Pa·s or less at 90° C. and the sheet has a certain measure of fluidity; thus, voids or filler segregation can be restrained from being generated near the outer circumference of the sealed body to be formed. Furthermore, because of the viscosity of 50000 Pa·s or less at 90° C., at a low pressure the semiconductor chip(s) can be buried into the sealing sheet. Accordingly, even when a large-sized sealed-body-forming apparatus for applying a high pressure is not used, the sealed body can be formed using a simple apparatus. Additionally, the viscosity is 1 Pa·s or more at 90° C.; thus, a resin constituting the sealing sheet can be restrained from flowing largely into a surface direction of the sheet by pressure when the sealed body is formed.

It is preferred in this structure that when a sealing sheet piece obtained by cutting out the sealing sheet into a size of 22 cm in length×22 cm in width is put onto a chip-stacked glass carrier of 22 cm in length×22 cm in width, on which semiconductor chips each of 7 mm in length×7 mm in width×200 μm in thickness are mounted to have a chip-mounted interval (interval between edges of any adjacent two of the chips) of 3 mm, the number of the chips being 20 in each length direction line of this carrier and being 20 in each width direction line thereof, and then the resultant is flat-plate-pressed at a pressing pressure of 1 MPa and a pressing temperature of 90° C. for a pressing period of 120 seconds, the ratio of a change in the dimension of the resultant product is 20% or less of the dimension of the product which is not yet pressed before the flat-plate-pressing.

When the dimension change ratio is 20% or less, the resin constituting the sealing sheet can be restrained further from flowing largely into the sheet surface direction by pressure when the sealed body is formed.

Effect of the Invention

The present invention makes it possible to provide a sealing sheet about which at the time of forming a sealed body in which one or more semiconductor chips are buried in the sealing sheet, voids or filler segregation can be restrained from being generated in the sheet.

MODE FOR CARRYING OUT THE INVENTION

Hereinafter, an embodiment of the present invention will be described with reference to the drawings. However, the invention is not limited only to the embodiment.

(Sealing Sheet)

Figure 1:
FIG. 1 is a schematic cross section of a sealing sheet according to the present embodiment.

FIG. 1 is a schematic sectional view of a sealing sheet according to the present embodiment.

About this sealing sheet, which is a sheet 40, the viscosity at 90° C. ranges preferably from 1 to 50000 Pa·s, more preferably from 10 to 35000 Pa·s, even more preferably from 40 to 10000 Pa's. The viscosity of the sealing sheet 40 is 50000 Pa·s or less at 90° C.; thus, semiconductor chips 53 (see FIG. 2) can be suitably buried into the sealing sheet 40. Moreover, the viscosity is 50000 Pa·s or less at 90° C. and the sheet has a certain measure of fluidity. Thus, voids or filler segregation can be restrained from being generated near the outer circumference of the sealed body to be formed, which is a body 58 (see FIG. 4). Furthermore, because of the viscosity of 50000 Pa·s or less at 90° C., at a low pressure the semiconductor chips 53 can be buried into the sealing sheet 40. Accordingly, even when a large-sized sealed-body-forming apparatus for applying a high pressure is not used, the sealed body can be formed using a simple apparatus. Additionally, the viscosity is 1 Pa·s or more at 90° C. Thus, a resin constituting the sealing sheet 40 can be restrained from flowing largely into a surface direction of the sheet by pressure when the sealed body is formed. The method for controlling the viscosity of the sealing sheet 40 at 90° C. into the above-mentioned numerical range may be, for example, the control of the blend of an organic component or the addition amount of a filler into the sheet.

About the sealing sheet 40, when a sealing sheet piece obtained by cutting out the sealing sheet into a size of 22 cm in length×22 cm in width is put onto a chip-stacked glass carrier of 22 cm in length×22 cm in width, on which semiconductor chips each of 7 mm in length×7 mm in width×200 μm in thickness are mounted to have a chip-mounted interval (interval between edges of any adjacent two of the chips) of 3 mm, the number of the chips being 20 in each length direction line of this carrier and being 20 in each width direction line thereof, and then the resultant is flat-plate-pressed at a pressing pressure of 1 MPa and a pressing temperature of 90° C. for a pressing period of 120 seconds, the ratio of a change of the dimension of the resultant product is 20% or less of the dimension of the product which is not yet pressed before the flat-plate-pressing. The change ratio ranges more preferably from 10 to 15%, even more preferably from 5 to 10%. When the dimension change ratio of the sealing sheet 40 is 20% or less, the resin constituting the sealing sheet can be further restrained from flowing largely into the sheet surface direction by pressure when the sealed body is formed. A specific method for measuring the dimension change ratio is according to a method described in EXAMPLES.

(Sealing Sheet)

The constituent material of the sealing sheet 40 preferably contains an epoxy resin, and a phenolic resin as a curing agent. According to this case, the sheet 10 can gain a good thermosetting property.

The epoxy resin is not especially limited. For example, various kinds of epoxy resins can be used such as a triphenylmethane-type epoxy resin, a cresol novolac-type epoxy resin, a biphenyl-type epoxy resin, a modified bisphenol A-type epoxy resin, a bisphenol A-type epoxy resin, a bisphenol F-type epoxy resin, a modified bisphenol F-type epoxy resin, a dicyclopentadiene-type epoxy resin, a phenol novolac-type epoxy resin, and a phenoxy resin. These epoxy resins may be used alone or in combination of two or more thereof.

From the viewpoint of securing the toughness of the epoxy resin after curing and the reactivity of the epoxy resin, epoxy resins are preferable which are solid at normal temperature and have an epoxy equivalent of 150 to 200 and a softening point or melting point of 50 to 130° C. Among these epoxy resins, a triphenylmethane-type epoxy resin, a cresol novolac-type epoxy resin, and a biphenyl-type epoxy resin are more preferable from the viewpoint of reliability.

The phenol resin is not especially limited as long as it initiates curing reaction with the epoxy resin. For example, there can be used a phenol novolac resin, a phenolaralkyl resin, a biphenylaralkyl resin, a dicyclopentadiene-type phenol resin, a cresol novolac resin, a resol resin, etc. These phenol resins may be used alone or in combination of two or more thereof.

From the viewpoint of the reactivity with the epoxy resin, phenol resins are preferably used which have a hydroxy group equivalent of 70 to 250 and a softening point of 50 to 110° C. Among these phenol resins, a phenol novolac resin is more preferably used from the viewpoint of its high curing reactivity. Further, phenol resins having low moisture absorbability can be also preferably used such as a phenolaralkyl resin and a bisphenylaralkyl resin from the viewpoint of reliability.

For the compounding ratio of the phenol resin to the epoxy resin, the epoxy resin and the phenol resin are preferably compounded so that the total amount of the hydroxy group in the phenol resin is 0.7 to 1.5 equivalents, and more preferably 0.9 to 1.2 equivalents, to 1 equivalent of the epoxy group in the epoxy resin.

The total content of the epoxy resin and the phenol resin in the sealing sheet 40 is preferably 2.5% by weight or more, and more preferably 3.0% by weight or more. If the content is 2.5% by weight or more, good adhering strength to the semiconductor chips 53 can be obtained. The total content of the epoxy resin and the phenol resin in the sealing sheet 40 is preferably 20% by weight or less, and more preferably 10% by weight or less. If the content is 20% by weight or less, moisture absorbability can be decreased.

The sealing sheet 40 may contain a thermoplastic resin. This makes it possible to provide a handling property when the sealing sheet 40 is uncured and low stress property to the cured product.

Examples of the thermoplastic resin include natural rubber, butyl rubber, isoprene rubber, chloroprene rubber, an ethylene-vinylacetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, a fluororesin, and a styrene-isobutylene-styrene block copolymer. These thermoplastic resins may be used alone or in combination of two or more thereof. Among these, a styrene-isobutylene-styrene block copolymer is preferable from the viewpoint of its low stress property and low moisture absorption.

The content of the thermoplastic resin in the sealing sheet 40 may be 1.5% by weight or more, or 2.0% by weight or more. If the content is 1.5% by weight or more, the flexibility can be obtained. The content of the thermoplastic resin in the sealing sheet 40 is preferably 6% by weight or less, and more preferably 4% by weight or less. If the content is 4% by weight or less, the adhesion with the semiconductor chips 53 is good.

The sealing sheet 40 preferably contains an inorganic filler.

The inorganic filler is not especially limited, and various kinds of conventionally known fillers can be used. Examples thereof include powers of quartz glass, talc, silica (such as fused silica and crystalline silica), alumina, aluminum nitride, silicon nitride, and boron nitride. These may be used alone or in combination of two or more kinds. Among these, silica and alumina are preferable, and silica is more preferable due to the reason that the linear expansion coefficient can be satisfactorily decreased.

As silica, silica powers are preferable, and fused silica powers are more preferable. Examples of the fused silica powders include spherical fused silica powders and crushed and fused silica powders. However, spherical fused silica powders are preferable from the viewpoint of fluidity. Among these, powers having an average particle size of 1 to 30 μm are preferable, and powders having an average particle size of 3 to 25 μm are more preferable.

The average particle size can be obtained, for example, by measurement on a sample that is extracted arbitrarily from the population using a laser diffraction-scattering type particle size distribution measuring apparatus. Among these, silica powders are preferable having an average particle size of 10 μm to 30 μm, and more preferable having an average particle size of 15 μm to 25 μm.

For example, the average particle size can be measured by using a laser diffraction-scattering type particle size distribution measuring apparatus on a sample that is arbitrarily extracted from the population.

The content of the inorganic filler in the sealing sheet 40 is preferably 75% by weight to 95% by weight, and more preferably 78% by weight to 95% by weight relative to the total content of the sealing sheet 40. If the content of the inorganic filler is 75% by weight or more relative to the total content of the sealing sheet 40, the thermal expansion coefficient can be kept low, and thus mechanical damage due to thermal impact can be suppressed. On the other hand, if the content of the inorganic filler is 95% by weight or less relative to the total content of the sealing sheet 40, the flexibility, the fluidity, and the adhesion become more satisfactory.

The sealing sheet 40 preferably contains a curing accelerator.

The curing accelerator is not especially limited as long as it promotes curing of the epoxy resin and the phenol resin, and examples of the curing accelerator include organophosphate compounds such as triphenylphosphine and tetraphenylphosphonium tetraphenylborate; and imidazole compounds such as 2-phenyl-4,5-dihydroxymethylimidazole and 2-phenyl-4-methyl-5-hydroxymethylimidazole. Among these, 2-phenyl-4,5-dihydroxymethylimidazole is preferable due to the reason that the curing reaction does not rapidly proceed even when the temperature increases during kneading and the sealing sheet 40 can be produced satisfactorily.

The content of the curing accelerator is preferably 0.1 to 5 parts by weight to the total 100 parts by weight of the epoxy resin and the phenol resin.

The sealing sheet 40 may contain a flame retardant component. This makes it possible to reduce an expansion of combustion when the sealing sheet 40 catches fire due to short circuit of the parts or heat generation. Examples of the flame retardant component include various kinds of metal hydroxides such as aluminum hydroxide, magnesium hydroxide, iron hydroxide, calcium hydroxide, tin hydroxide, and composite metal hydroxide; and a phosphazene flame retardant.

The sealing sheet 40 preferably contains a silane coupling agent. The silane coupling agent is not especially limited, and an example includes 3-glycidoxypropyl trimethoxysilane.

The content of the silane coupling agent in the sealing sheet 40 is preferably 0.1 to 3% by weight. If the content is 0.1% by weight or more, the strength of the cured product is sufficiently made high, so that the water absorption can be lowered. If the content is 3% by weight or less, the amount of outgas can be decreased.

The sealing sheet 40 is preferably colored. With this configuration, The sealing sheet 40 can exhibit an excellent marking property and an excellent appearance, and a semiconductor device can be obtained having an appearance with added value. Because the colored sealing sheet 40 has an excellent marking property, various information such as character information and pattern information can be given by marking. Especially, the information such as character information and pattern information that is given by marking can be recognized visually with excellent visibility by controlling the color. It is possible to color-code the sealing sheet 40 by product, for example. When the sealing sheet 40 is colored (when it is not colorless or transparent), the color is not especially limited. However, the color is preferably a dark color such as black, blue, or red, and black is especially preferable.

When the sealing sheet 11 is colored, a coloring material (colorant) is usable in accordance with a target color. Various dark color materials such as black color materials, blue color materials, and red color materials can be suitably used, and especially the black color materials are suitable. The color materials may be any of pigments, dyes, and the like. The color materials can be used alone or two types or more can be used together. Any dyes such as acid dyes, reactive dyes, direct dyes, dispersive dyes, and cationic dyes can be used. The pigments are also not especially limited in the form, and may be appropriately selected from known pigments.

Besides the above-mentioned individual components, any other additive may be appropriately blended into the sealing sheet 40, as required.

The thickness of the sealing sheet 40 is not particularly limited, and may be, for example, from 50 to 2000 μm, preferably from 70 to 1200 μm, even more preferably from 100 to 700 μm from the viewpoint of the use of the sheet 40 as a sealing sheet, and from the reason that the semiconductor chips 53 can be suitably buried into the sheet in a burying step (step D, which will be detailed later).

The method of manufacturing the sealing sheet 40 is not especially limited; however, preferred examples are a method of preparing a kneaded product of the resin composition for forming the sealing sheet 40 and applying the obtained kneaded product and a method of subjecting the obtained kneaded product to plastic-working to be formed into a sheet shape. This makes it possible to produce the sealing sheet 40 without using a solvent. Therefore, the effects on the semiconductor chip 53 from the volatilized solvent can be suppressed.

Specifically, each component is melted and kneaded with a known kneader such as a mixing roll, a pressure kneader, or an extruder to prepare a kneaded product, and the obtained kneaded product is applied or plastic-worked into a sheet shape. As a kneading condition, the temperature is preferably the softening point or higher of each component described above, and is for example 30 to 150° C. When the thermal curing property of the epoxy resin is considered, the temperature is preferably 40 to 140° C., and more preferably 60 to 120° C. The time is for example 1 to 30 minutes, and preferably 5 to 15 minutes.

The kneading is preferably performed under a reduced pressure condition (under reduced pressure atmosphere). This makes it possible to remove gas, and to prevent invasion of gas into the kneaded product. The pressure under the reduced pressure condition is preferably 0.1 kg/cm² or less, and more preferably 0.05 kg/cm² or less. The lower limit of the pressure under reduced pressure is not especially limited; however, it is $1 \times 10^{-4}$ kg/cm$^2$ or more.

When the kneaded product is applied to form the sealing sheet 40, the kneaded product after being melt-kneaded is preferably applied while it is at high temperature without being cooled. The application method is not especially limited, and examples thereof include bar coating, knife coating, and slot-die coating. The application temperature is preferably the softening point or higher of each component described above. When the thermal curing property and molding property of the epoxy resin are considered, the temperature is for example 40 to 150° C., preferably 50 to 140° C., and more preferably 70 to 120° C.

When forming the sealing sheet 40 by plastic-working the kneaded product, the kneaded product after melt-kneaded is preferably subjected to plastic-working while it is at high temperature without being cooled. The plastic-working process is not especially limited, and examples thereof include flat plate pressing, T-die extrusion, screw-die extrusion, rolling, roll kneading, inflation extrusion, coextrusion, and calendar molding. The temperature for plastic-working is preferably the softening point or higher of each component described above. When the thermal curing property and molding property of the epoxy resin are considered, the temperature is for example 40 to 150° C., preferably 50 to 140° C., and more preferably 70 to 120° C.

The resin, etc. for forming the sealing sheet 40 can be dissolved and dispersed into an appropriate solvent to prepare varnish, and the varnish can be applied to obtain the sealing sheet 40.

(Production Method for Semiconductor Device)

Hereinafter, a description will be made about a production method according to the present embodiment for a semiconductor device with reference to FIGS. 2 to 9. FIGS. 2 to 9 are schematic sectional views for explaining the semiconductor device production method according to the embodiment. The description below is firstly about a production method for a semiconductor device designated the so-called fan-out wafer level package (WLP).

The production method for a semiconductor device according to the present embodiment includes at least the following:

step A of providing a stacked body including a temporary-fixation member and one or more semiconductor chips fixed onto the temporary-fixation member, step B of providing a sealing sheet, step C of arranging the sealing sheet over the semiconductor chip(s) of the stacked body, and step D of burying the semiconductor chip(s) into the sealing sheet to forma sealed body in which the semiconductor chip(s) is/are buried in the sealing sheet.

[Stacked Body Providing Step]

Figure 2:
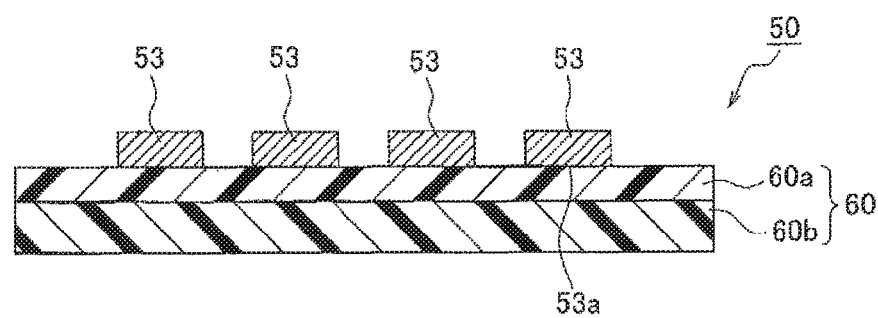
FIG. 2 is a schematic cross section for explaining a method for manufacturing a semiconductor device according to the present embodiment.

As illustrated in FIG. 2, in the semiconductor device production method according to the present embodiment, a stacked body 50 is initially provided in which semiconductor chips 53 are temporarily fixed onto a temporary-fixation member 60 (step A). The stacked body 50 can be obtained, for example, through a temporary-fixation providing step and a semiconductor chip temporarily fixing step each detailed below.

<Tentatively Fixing Member Providing Step>

In a tentatively fixing member providing step, provided is a temporary-fixation member 60 in which a thermally expansive pressure-sensitive adhesive layer 60a is stacked on a supporting substrate 60b (see FIG. 2). Instead of the thermally expansive pressure-sensitive adhesive layer, a radiation curable pressure-sensitive adhesive layer is usable.

In the present embodiment, a description is made about the temporary-fixation member 60 that is a member having a thermally expansive pressure-sensitive adhesive layer. However, the temporary-fixation member, in which the thermally expansible pressure-sensitive adhesive layer is laminated onto the supporting substrate, is described in detail in JP-A-2014-015490 and others; thus, the temporary-fixation member will be briefly described below.

(Thermally Expansive Pressure-Sensitive Adhesive Layer)

The thermally expansive pressure-sensitive adhesive layer 60a may be made of a pressure-sensitive adhesive composition containing a polymer component and a foaming agent. The polymer component (particularly as a base polymer) is preferably an acrylic polymer (which may be referred to as an "acrylic polymer A"). The acrylic polymer A may be a polymer made from a (meth)acrylate as a main monomer component. Examples of the (meth)acrylate include alkyl (meth)acrylates (for example, linear or branched alkyl esters in which the alkyl group has 1 to 30 carbon atoms, in particular, 4 to 18 carbon atoms, examples of these esters including methyl, ethyl, propyl, isopropyl, butyl, isobutyl, sec-butyl, t-butyl, pentyl, isopentyl, hexyl, heptyl, octyl, 2-ethylhexyl, isooctyl, nonyl, decyl, isodecyl, undecyl, dodecyl, tridecyl, tetradecyl, hexadecyl, octadecyl, and eicosyl esters); and cycloalkyl (meth)acrylates (for example, cyclopentyl and cyclohexyl esters). These (meth)acrylates may be used alone or in any combination of two or more thereof.

The acrylic polymer A may contain a unit corresponding to a different monomer component copolymerizable with the (meth)acrylate, as required, in order to be improved in cohesive strength, heat resistance, crosslinkability and others.

The weight-average molecular weight of the acrylic polymer A is not particularly limited, and is preferably from about 350000 to 1000000, more preferably from about 450000 to 800000.

As described above, the thermally expansive pressure-sensitive adhesive layer 60a contains a foaming agent for giving thermal expansivity to this layer. Thus, in a state that a sealed body 58 is formed on the thermally expansive pressure-sensitive adhesive layer 60a of the temporary-fixation member 60 (see FIG. 5), at least a portion of the temporary-fixation member 60 is heated at any time to foam and/or expand the foaming agent contained in the heated portion of the thermally expansive pressure-sensitive adhesive layer 60a. Thus, at least the portion of the thermally expansive pressure-sensitive adhesive layer 60a expands. By the expansion of at least the portion of the thermally expansive pressure-sensitive adhesive layer 60a, the adhesive surface of this layer (the interface thereof with the sealed body 58), which corresponds to the expanding portion, is deformed into a bumpy form to decrease the area of the adhesive surface between the thermally expansive pressure-sensitive adhesive layer 60a and the sealed body 58. The decrease makes it possible to reduce the adhering strength between the two to peel the sealed body 58 from the temporary-fixation member 60 (see FIG. 6).

(Foaming Agent)

The foaming agent used in the thermally expansive pressure-sensitive adhesive layer 60a is not particularly limited, and is appropriately selectable from known foaming agents. About the foaming agent, a single species thereof or a combination of two or more species thereof may be used. The foaming agent is preferably thermally expansive microspheres.

(Thermally Expansive Microspheres)

The thermally expansive microspheres are not particularly limited, and are appropriately selectable from known thermally expansive microspheres (such as various inorganic thermally expansive microspheres and organic thermally expansive microspheres). The thermally expansive microspheres are preferably usable in the form of a microencapsulated foaming agent from the viewpoint of an easy blending operation thereof, and others. Such thermally expansive microspheres are, for example, microspheres obtained by encapsulating a substance which is heated to be easily gasified and expanded, such as isobutane, propane or pentane, into an elastic shell. In many cases, the shell is made of a thermally meltable substance or a substance which is thermally expansive to be broken. Examples of the substance that forms the shell include a vinylidene chloride-acrylonitrile copolymer, polyvinyl alcohol, polyvinyl butyral, polymethyl methacrylate, polyacrylonitrile, polyvinylidene chloride, and polysulfone.

The thickness of the thermally expansive pressure-sensitive adhesive layer is not particularly limited, and is appropriately selectable in accordance with the above-mentioned adhering-strength-lowering property of this layer, and others. The thickness is, for example, from about 5 to 300 µm (preferably from about 20 to 150 µm).

The thermally expansive pressure-sensitive adhesive layer may have a monolayered or multilayered structure.

In the present embodiment, the thermally expansive pressure-sensitive adhesive layer may contain various additives (such as a colorant, a thickener, an extender, a filler, a tackifier, a plasticizer, an antiaging agent, an antioxidant, a surfactant, and a crosslinking agent).

(Supporting Substrate)

The supporting substrate 60b is a thin plate-shaped member functioning as a strength base for the temporary-fixation member 60. The material of the supporting substrate 60b may be appropriately selected, considering the handleability and the heat resistance thereof, and others. Examples of the material include metal materials such as SUS; plastic materials such as polyimide, polyamideimide, polyetheretherketone, and polyethersulfone; glass; and a silicon wafer. A plate of SUS, out of these materials, is preferred from the viewpoint of the heat resistance, the strength, the reusability, and others.

The thickness of the supporting substrate 60b is appropriately selectable considering a target strength thereof and the handleability. The thickness is preferably from 100 to 5000 µm, more preferably from 300 to 2000 µm.

(Method for Forming Tentatively Fixing Member)

The temporary-fixation member 60 is obtained by forming the thermally expansive pressure-sensitive adhesive layer 60a onto the supporting substrate 60b. The thermally expansive pressure-sensitive adhesive layer can be formed by, for example, a conventional method of mixing a pressure-sensitive adhesive, a foaming agent (such as thermally expansive microspheres), and a solvent, other additives and so on that are optionally used, and then forming the mixture into a layer in a sheet form. Specifically, the thermally expansive pressure-sensitive adhesive layer can be formed by, for example, a method of applying, onto the supporting substrate 60b, a mixture containing a pressure-sensitive adhesive, a foaming agent (such as thermally expansive microspheres), and a solvent and other additives that are optionally used, or a method of applying the same mixture onto an appropriate separator (such as a release paper piece) to form a thermally expansive pressure-sensitive adhesive layer, and transferring (transcribing) this layer onto the supporting substrate 60b.

(Method for Thermally Expanding Thermally Expansive Pressure-Sensitive Adhesive Layer)

In the present embodiment, the thermally expansive pressure-sensitive adhesive layer can be thermally expanded by heating. The method for the heating can be performed using, for example, an appropriate heating means such as a hot plate, a hot air drier, a near infrared lamp or an air drier. In the heating, it is sufficient for the heating temperature to be not lower than the foaming starting temperature (thermal expansion starting temperature) of the foaming agent (such as the thermally expansive microspheres) in the thermally expansive pressure-sensitive adhesive layer. Conditions for the heating may be appropriately set in accordance with the reduction property of the adhesive surface area, the property being dependent on the kind of the foaming agent (such as the thermally expansive microspheres) and others, the heat resistance of the sealed body containing the supporting substrate and the semiconductor chips or of others, the heating method (the thermal capacity and the heating means, and others), and others. The heating conditions are generally as follows: a temperature of 100 to 250° C., and a period of 1 to 90 seconds (according to, for example, a hot plate), or a period of 5 to 15 minutes (according to, for example, a hot air drier). The heating may be performed at an appropriate stage in accordance with a purpose of the use. As a heat source in the heating, an infrared lamp or heated water may be usable.

<Semiconductor Chip Temporarily Fixing Step>

In a semiconductor chip temporarily fixing step, plural semiconductor chips as the chips 53 are arranged and temporarily fixed onto the provided temporary-fixation member 60 to arrange their circuit-forming surfaces 53a to face the temporary-fixation member 60 (see FIG. 2). For the temporary fixation of the semiconductor chips 53, a known device, for example, a flip chip bonder and a die bonder, is usable.

The layout of the arrangement of the semiconductor chips 53, and the number of the chips arranged may be appropriately set in accordance with, for example, the shape and the size of the temporary-fixation member 60, and the number of target packages produced. When viewed in plan, the shape and the size of the stacked body 50 (temporary-fixation member 60) are not particularly limited. The shape may be a rectangular shape having each side having a length of 300 mm or more, or a rectangular shape having each side having a length of 500 mm or more. The above has described an example of the stacked body providing step.

[Step of Providing Sealing Sheet]

In the semiconductor device production method according to the present embodiment, a sealing sheet 40 is provided (step B), as illustrated in FIG. 1. The sealing sheet 40 may be provided in a state of being laminated on a peeling liner 41 such as a polyethylene terephthalate (PET) film.

[Step of Arranging Sealing Sheet and Stacked Body]

Figure 3:
FIG. 3 is a schematic cross section for explaining a method for manufacturing a semiconductor device according to the present embodiment.
Figure 3:
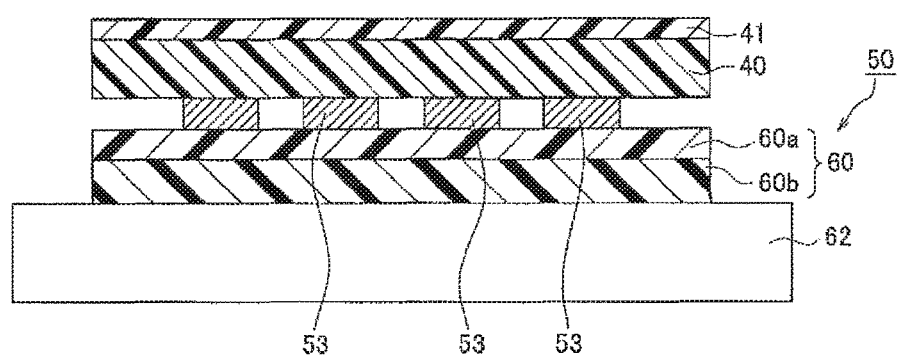

After the step of providing a sealing Sheet, as illustrated in FIG. 3, the stacked body 50 is arranged onto a lower heating plate 62 to direct the semiconductor-chip-53-temporarily-fixed surface of the stacked body 50 upward, and further the sealing sheet 40 is arranged onto the semiconductor-chip-53-temporarily-fixed surface of the stacked body 50 (step C). In this step, it is allowable to arrange the stacked body 50 initially onto the lower heating plate 62, and subsequently arrange the sealing sheet 40 onto the stacked body 50, or to stack the sealing sheet 40 first onto the stacked body 50, and subsequently arrange the resultant stacked body, in which the sealing sheet 40 is stacked on the stacked body 50, onto the lower heating plate 62.

[Step of Forming Sealed Body]

Figure 4:
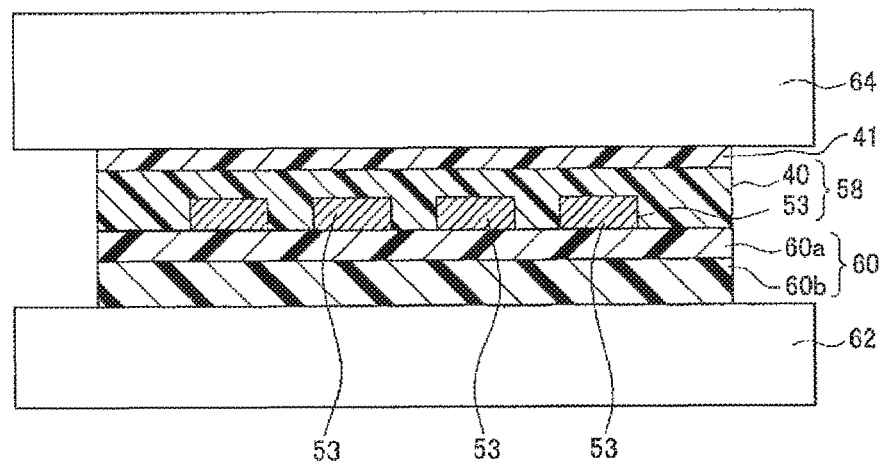
FIG. 4 is a schematic cross section for explaining a method for manufacturing a semiconductor device according to the present embodiment.
Figure 5:
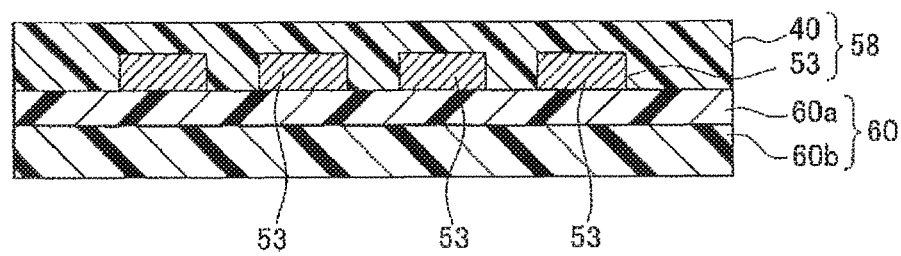
FIG. 5 is a schematic cross section for explaining a method for manufacturing a semiconductor device according to the present embodiment.

Next, as illustrated in FIG. 4, the lower heating plate 62 and an upper heating plate 64 are used to hot-press the workpiece to bury the semiconductor chips 53 into the sealing sheet 40 to form a sealed body 58 in which the semiconductor chips 53 are buried in the sealing sheet 40 (Step D). The sealing sheet 40 comes to function as a sealing resin for protecting the semiconductor chips 53 and elements accompanying the chips from the external environment. This process has given the sealed body 58, in which the semiconductor chips 53 fixed temporarily onto the temporary-fixation member 60 are buried in the sealing sheet 40.

Specifically, about conditions for the hot press when the semiconductor chips 53 are buried into the sealing sheet 40, the temperature is preferably from 40 to 150° C., more preferably from 60 to 120° C., the pressure is, for example, from 0.1 to 10 MPa, preferably from 0.5 to 8 MPa, and the period is, for example, from 0.3 to 10 minutes, preferably from 0.5 to 5 minutes. The method for the hot press may be parallel plate press, or roll press. Out of the two, parallel plate press is preferred. The present embodiment makes use of the sealing sheet 40, about which the viscosity at 90° C. is 50000 Pa·s or less. Thus, the semiconductor chips 53 can be buried into the sealing sheet 40 at a lower pressure than that in the prior art. Accordingly, even at a low pressure of, particularly, 5 MPa or less, 3 MPa or less, 1.5 MPa or less, or 0.75 MPa or less in the above-mentioned numerical range, the semiconductor chips 53 can be suitably buried into the sealing sheet 40.

In this way, a semiconductor device can be obtained in which the semiconductor chips 53 are buried in the sealing sheet 40. The press is performed preferably under reduced pressure conditions, considering the adhesiveness and the following-performance of the sealing sheet 40 to the semiconductor chips 53 and the temporary-fixation member 60.

About the reduced pressure conditions, the pressure is, for example, from 0.1 to 5 kPa, preferably from 0.1 to 100 Pa, and the reduced pressure holding period (period from the start of a reduction in the pressure to the start of the press) is, for example, from 5 to 600 seconds, preferably from 10 to 300 seconds.

[Step of Peeling Off the Peeling Liner]

Figure 6:
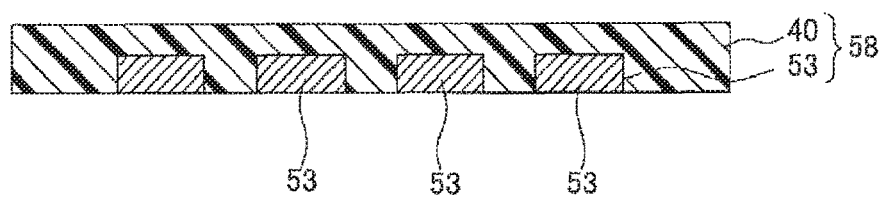
FIG. 6 is a schematic cross section for explaining a method for manufacturing a semiconductor device according to the present embodiment.

Next, the peeling liner 41 is peeled off (see FIG. 6).

[Thermal Curing Step]

Next, the sealing sheet 40 is thermally cured. Specifically, for example, the whole of the sealed body 58 is heated, in which the semiconductor chips 53 fixed tentatively on the temporary-fixation member 60 are embedded in the sealing sheet 40.

About conditions for the thermal setting, the heating temperature is preferably 100° C. or higher, preferably 120° C. or higher. The upper limit of the heating temperature is preferably 200° C. or lower, more preferably 180° C. or lower. The heating period is preferably 10 minutes or longer, more preferably 30 minutes or longer. The upper limit of the heating period is preferably 180 minutes or shorter, more preferably 120 minutes or shorter. As needed, the setting may be attained under an increased pressure. The pressure is preferably 0.1 MPa or more, more preferably 0.5 MPa or more. The upper limit thereof is preferably 10 MPa or less, more preferably 5 MPa or less.

[Step of Peeling Thermally Expansive Pressure-Sensitive Adhesive Layer]

Next, as illustrated in FIG. 6, the temporary-fixation member 60 is heated to thermally expand the thermally expansive pressure-sensitive adhesive layer 60*a* to peel the thermally expansive pressure-sensitive adhesive layer 60*a* and the sealed body 58 from each other. Alternatively, the following method is also preferably adoptable: a method of peeling the supporting substrate 60*b* and the thermally expansive pressure-sensitive adhesive layer 60*a* from each other at the interface therebetween, and then peeling the thermally expansive pressure-sensitive adhesive layer 60*a* and the sealed body 58 from each other at the interface therebetween by thermal expansion. In any one of these cases, the thermally expansive pressure-sensitive adhesive layer 60*a* is heated to be thermally expanded, thereby being lowered in adhesive strength to make it possible to peel the thermally expansive pressure-sensitive adhesive layer 60*a* and the sealed body 58 easily from each other at the interface therebetween. It is preferred to adopt, as conditions for the thermal expansion, the conditions in the above-mentioned column "Method for Thermally Expanding Thermally Expansive Pressure-Sensitive Adhesive Layer." The thermally expansive pressure-sensitive adhesive layer is in particular preferably formed to have a structure permitting this layer not to be peeled by the heating in the above-mentioned thermal curing step but to be peeled by the heating in this step of peeling the thermally expansive pressure-sensitive adhesive layer.

[Step of Grinding Sheet for Sealing]

Figure 7:
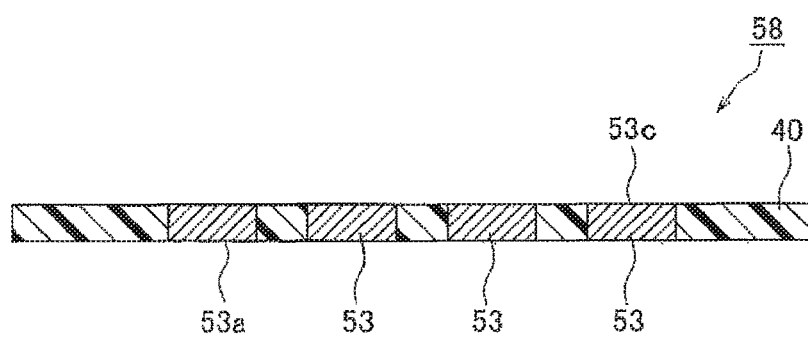
FIG. 7 is a schematic cross section for explaining a method for manufacturing a semiconductor device according to the present embodiment.

Next, as illustrated in FIG. 7, the sealing sheet 40 in the sealed body 58 is ground to expose the respective rear surfaces 53*c* of the semiconductor chips 53, as required. The method for grinding the sealing sheet 40 is not particularly limited, and may be, for example, a grinding method using a grinding stone rotatable at a high velocity.

(Re-Interconnect Forming Step)

The present embodiment preferably includes a re-interconnect forming step of forming re-interconnects 69 on the circuit-forming surfaces 53*a* of the semiconductor chips 53 of the sealed body 58. In the re-interconnect forming step, after the peeling of the temporary-fixation member 60, the re-interconnects 69, which are connected to the exposed semiconductor chips 53, are formed on the sealed body 58 (see FIG. 9).

In a method for forming the re-interconnects, for example, a known method such as a vacuum-deposition method is used to form a metal seed layer onto the exposed semiconductor chips 53, and then the re-interconnects 69 can be formed by a known method such as a semi-additive method.

Thereafter, an insulating layer of, for example, polyimide or PBO may be formed on the re-interconnects 69 and the sealed body 58.

(Bump Forming Step)

Figure 8:
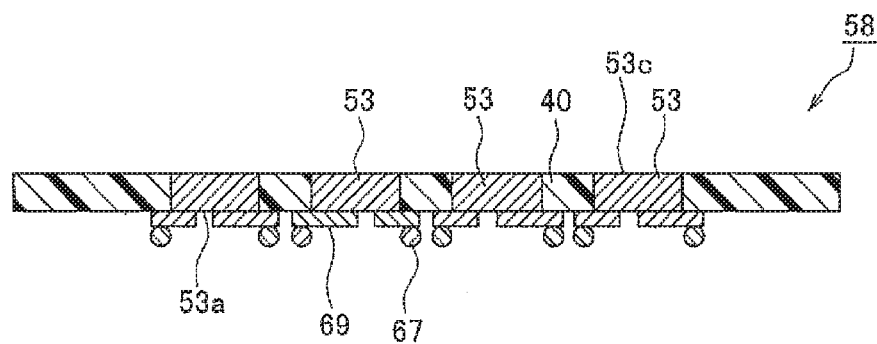
FIG. 8 is a schematic cross section for explaining a method for manufacturing a semiconductor device according to the present embodiment.

Next, a bumping processing may be performed in which bumps 67 are formed on the formed re-interconnects 69 (see FIG. 8). The bumping processing may be performed by a known method using, for example, solder balls or solder plating.

(Dicing Step)

Figure 9:
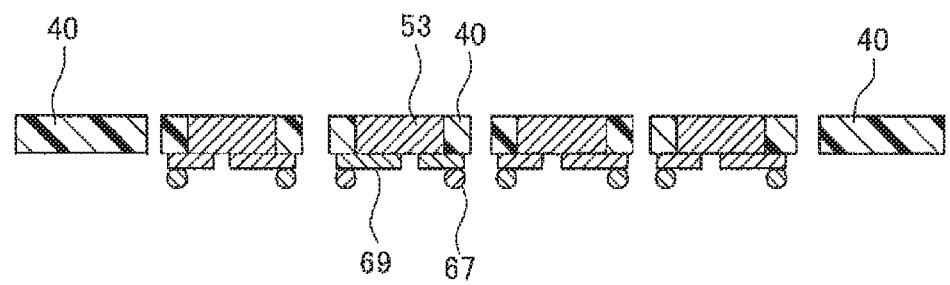
FIG. 9 is a schematic cross section for explaining a method for manufacturing a semiconductor device according to the present embodiment.

Lastly, the stacked body, which is composed of the semiconductor chips 53, the sealing sheet 40, the re-interconnects 69, and the other elements, is diced (see FIG. 9). This step can give the semiconductor devices 59 in the state that the interconnects are led to the outside of the chip regions.

In the above-mentioned embodiment, the description has been made about a case where the "stacked body" is the "stacked body 50, in which the semiconductor chips 53 are temporarily fixed onto the temporary-fixation member 60". However, the "stacked body" in the present invention is not limited to this example. It is sufficient for the stacked body to be a stacked body in which one or more semiconductor chips are fixed on to a support having a certain measure of strength. In other words, it is sufficient for the "stacked body" to be a "stacked body in which one or more semiconductor chips are fixed onto a support". Other examples of the "stacked body" in the invention include a "stacked body in which one or more semiconductor chips are flip-chip-bonded to a circuit-forming surface of a semiconductor wafer" (the so-called chip-on-wafer) and a "stacked body in which one or more semiconductor chips are mounted on an organic substrate".

Hereinafter, the present invention will be described in detail by way of examples thereof. However, the invention is not limited to the examples as far as any other example does not depart from the subject matters of the present invention. In each of the examples, the word "part(s)" denotes part(s) by weight unless otherwise specified.

Production Example 1

<Production of Sealing Sheet>

Individual components were blended with each other in accordance with a blend ratio in the following [Blend for Production Example 1], and then the blend was kneaded and subsequently made into a sheet form. In this way, each sealing sheet A having a thickness of 300 μm was produced.
[Blend for Production Example 1]
Epoxy resin 1 (YSLV-80XY, manufactured by Nippon Steel Chemical Corp.: 25.8 parts
Epoxy resin 2 (EPIKOTE 828, manufactured by Mitsubishi Chemical Corp.): 23.0 parts
Phenolic resin 3 (MEH-7800, manufactured by Meiwa Plastic Industries, Ltd.): 51.4 parts
Thermoplastic resin 2 (SG-P3, manufactured by Nagase ChemteX Corp.): 45.2 parts
Inorganic filler 3 (SO-25R (spherical silica), manufactured by Admatechs Co., Ltd.): 1356.7 parts
Silane coupling agent 1 (KBM-403, manufactured by Shin-Etsu Chemical Co., Ltd.): 1.4 parts
Pigment 1 (#20, manufactured by Mitsubishi Chemical Corp.): 4.5 parts
Setting promoter 1 (2PHZ-PW, manufactured by Shikoku Chemicals Corp.): 1.0 part
Components used in Production Examples 2 to 3 are described.
Epoxy resin 1: YSLV-80XY, manufactured by Nippon Steel Chemical Corp. (bisphenol F type epoxy resin; epoxy equivalent: 200 g/eq., and softening point: 80° C.)
Phenolic resin 1: MEH-7851-SS, manufactured by Meiwa Plastic Industries, Ltd. (phenolic resin having a biphenylaralkyl skeleton; hydroxyl equivalent: 203 g/eq., and softening point: 67° C.)
Thermoplastic resin 1: J-5800, manufactured by Mitsubishi Rayon Co., Ltd. (acrylic rubbery stress relaxation agent)
Inorganic filler 1: FB9454, manufactured by Denka Co., Ltd. (filler)
Silane coupling agent 1: KBM-403, manufactured by Shin-Etsu Chemical Co., Ltd. (3-glycidoxypropyltrimethoxysilane)
Pigment 1 (carbon black): #20, manufactured by Mitsubishi Chemical Corp. (particle diameter: 50 nm)

Setting promoter 1: 2PHZ-PW, manufactured by Shikoku Chemicals Corp. (2-phenyl-4,5-dihydroxymethylimidazole)

Production Example 2

<Production of Sealing Sheet>

Individual components were blended with each other in accordance with a blend ratio that is described in Table 1, and then the blend was kneaded and subsequently made into a sheet form. In this way, each sealing sheet B having a thickness of 300 μm was produced.

Production Example 3

<Production of Sealing Sheet>

Individual components were blended with each other in accordance with a blend ratio that is described in Table 1, and then the blend was kneaded and subsequently made into a sheet form. In this way, each sealing sheet C having a thickness of 300 μm was produced.

TABLE 1

|  | Production Example 2 | Production Example 3 |
| --- | --- | --- |
| Sealing sheet | Sealing sheet B | Sealing sheet C |
| Epoxy resin 1 (parts) | 48.6 | 48.6 |
| Phenolic resin 1 (parts) | 51.4 | 51.4 |
| Thermoplastic resin 1 (parts) | 44.9 | 24.4 |
| Inorganic filler 1 (parts) | 1097.3 | 943.5 |
| Silane coupling agent 1 (part(s)) | 1.1 | 0.9 |
| Pigment 1 (parts) | 3.7 | 3.2 |
| Setting promoter 1 (part) | 1.0 | 1.0 |

Production Example 4

<Production of Sealing Sheet>

Individual components were blended with each other in accordance with a blend ratio in the following [Blend for Production Example 4], and then the blend was kneaded and subsequently made into a sheet form. In this way, each sealing sheet D having a thickness of 300 μm was produced.
[Blend for Production Example 4]
Epoxy resin 1 (YSLV-80XY, manufactured by Nippon Steel Chemical Corp.: 34.9 parts
Epoxy resin 2 (828, manufactured by Mitsubishi Chemical Corp.): 33.8 parts
Phenolic resin 2 (MEH-7500-35, manufactured by Meiwa Plastic Industries, Ltd.): 31.3 parts
Inorganic filler 2 (5SDC, manufactured by Denaka Co., Ltd.): 542.3 parts
Inorganic filler 3 (SO-25R (spherical silica), manufactured by Admatechs Co., Ltd.): 144.2 parts
Silane coupling agent 1 (KBM-403, manufactured by Shin-Etsu Chemical Co., Ltd.): 0.7 part
Pigment 1 (#20, manufactured by Mitsubishi Chemical Corp.): 2.4 parts
Setting promoter 1 (2PHZ-PW, manufactured by Shikoku Chemicals Corp.): 1.0 part
(Measurement of Viscosity)

A viscoelascity measuring instrument ARES (manufactured by Rheometric Scientific Inc.) was used to measure any one of the samples (of each of the sealing sheet species A to D) at 90° C. Conditions for the measurement were as described below. The results are shown in Table 2.

<Conditions for Measurement>
Parallel plate: 8 mm in diameter
Frequency: 1 Hz
Strain: 5%
90° C. Constant-temperature measurement
Measuring period: 5 minutes (Measurement of Dimension Change Ratio)

About any one of the samples of each of the sealing sheet A to D, the dimension change ratio was measured. Specifically, the sealing sheet was initially cut into a size of 22 cm in length×22 cm in width. Provided were a chip-stacked glass carrier of 22 cm in length×22 cm in width, on which semiconductor chips each of 7 mm in length×7 mm in width×200 μm in thickness were mounted to have a chip-mounted interval (interval between edges of any adjacent two of the chips) of 3 mm. The number of the chips was 20 in each length direction line of this carrier, and was 20 in each width direction line thereof.

Next, the cut-out sealing sheet was put onto the provided chip-stacked glass carrier, and then the resultant was flat-plate-pressed at a pressing pressure of 1 MPa and a pressing temperature of 90° C. for a pressing period of 120 seconds. A measurement was then made about the length (dimension) of a line on the sealing sheet, this line being a line parallel to one side of the sealing sheet and passing through the center of the sealing sheet. Using the length of the line before the sealing (before the flat-plate-pressing) as a reference, the dimension change ratio of this sealing sheet was obtained. When the dimension change ratio was 20% or less of the dimension of the sealing sheet before the flat-plate-pressing, the sealing sheet was judged to be ○. Alternatively, when the dimension change ratio was more than 20% thereof, the sealing sheet was judged to be x. The results are shown in Table 2. The reason why the reference value of the change ratio is set to 20% is that when the value is 20% or less, voids or filler segregation is not easily generated near the outer circumference of the sealed body.

TABLE 2

|  | Viscosity (Pa · s) at 90° C. | Dimension change ratio (%) | Dimension change ratio evaluation |
|---|---|---|---|
| Sealing sheet A | 35000 | 1 | ○ |
| Sealing sheet B | 3600 | 3 | ○ |
| Sealing sheet C | 800 | 8 | ○ |
| Sealing sheet D | 40 | 12 | ○ |

(Void and Filler Segregation Evaluation)

Figure 10:
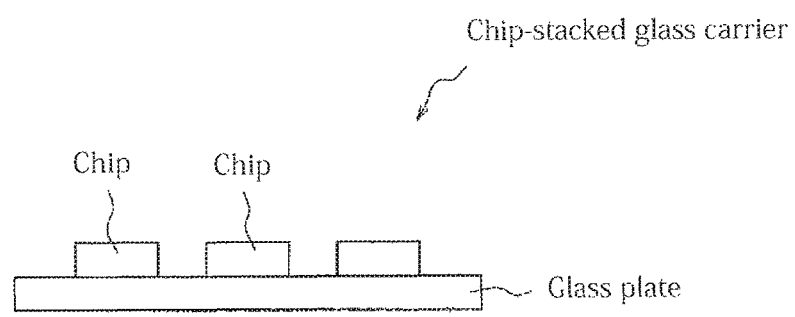
FIG. 10(a) is a front view for explaining each chip-stacked glass carrier used in the void evaluation.
FIG. 10(b) is a plan view thereof.
Figure 10:
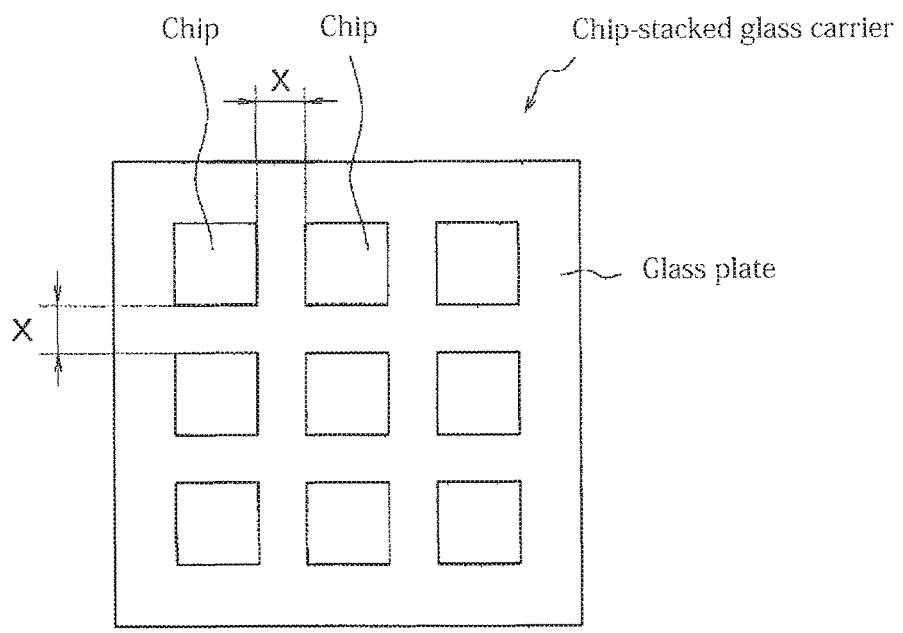

FIG. 10(a) is a front view for explaining each chip-stacked glass carrier used in the void evaluation, and FIG. 10(b) is a plan view thereof.

Provided was initially each glass plate of 50 mm in length×50 mm in width×7 mm in thickness. Next, chips were arranged onto the glass plate provided that the number of the chips was 3 in each length direction line of this plate, and was 3 in each width direction line thereof. In this way, the illustrated chip-stacked glass carrier was produced (see FIGS. 10(a) and 10(b)). As the chips, three kinds of chips were used which were a chip A of 7 mm in length×7 mm in width×200 μm in thickness, a chip B of 7 mm in length×7 mm in width×500 μm in thickness, and a chip C of 7 mm in length×7 mm in width×780 μm in thickness. The arrangement interval (each X in FIG. 10(b)) between any adjacent two of the chips was set to 4 patterns of 0.1 mm, 1 mm, 3 mm, and 5 mm. Each combination of the chip kinds with the chip interval is shown in Table 3.

TABLE 3

|  | Chip kinds | Chip interval (mm) |
|---|---|---|
| Chip-stacked glass carrier A | Chip A | 0.1 |
| Chip-stacked glass carrier B | (Thickness: 200 μm) | 5 |
| Chip-stacked glass carrier C | Chip B | 1 |
| Chip-stacked glass carrier D | (Thickness: 500 μm) | 3 |
| Chip-stacked glass carrier E | Chip C | 0.1 |
| Chip-stacked glass carrier F | (Thickness: 780 μm) | 5 |

Any one of the samples of each of the prepared sealing sheets was arranged onto any one of the prepared chip-stacked glass carriers. A vacuum press machine (machine name: VACUUM ACE, manufactured by Mikado Technos Co., Ltd.) was used to hot-press the resultant to yield a sealed body.

Hot pressing was performed several times, changing the combination of the chip-stacked glass carrier, the sealing sheet, and the pressure at the time of hot pressing. Tables 4 to 6 each show the combination of the chip-stacked glass carrier, the sealing sheet, and the pressure at the time of hot pressing. About conditions other than the pressure at the time of hot pressing, the vacuum degree, the pressing temperature, and the pressing period were set to 10 Pa, 90° C., and 120 seconds, respectively.

Thereafter, a surface and a cross section of each of the resultant pressed bodies were observed with the naked eye and through a microscope to check voids and filler segregation. As a result, when neither voids nor filler segregation was observed, the pressed body was judged to be ○. Alternatively, when at least one of voids and filler segregation was observed, the pressed body was judged to be x. The results are shown in Tables 4 to 6.

TABLE 4

|  | Chip-stacked glass carrier | Sealing sheet | Pressing pressure (MPa) | Voids |
|---|---|---|---|---|
| Example 1 | A | A | 0.1 | ○ |
| Example 2 |  | (35000 Pa · s) | 0.75 | ○ |
| Example 3 |  |  | 1.5 | ○ |
| Example 4 |  |  | 3 | ○ |
| Example 5 | A | B | 0.1 | ○ |
| Example 6 |  | (3600 Pa · s) | 0.75 | ○ |
| Example 7 |  |  | 1.5 | ○ |
| Example 8 |  |  | 3 | ○ |
| Example 9 | A | C | 0.1 | ○ |
| Example 10 |  | (800 Pa · s) | 0.75 | ○ |
| Example 11 |  |  | 1.5 | ○ |
| Example 12 |  |  | 3 | ○ |
| Example 13 | A | D | 0.1 | ○ |
| Example 14 |  | (40 Pa · s) | 0.75 | ○ |
| Example 15 |  |  | 1.5 | ○ |
| Example 16 |  |  | 3 | ○ |
| Example 17 | B | A | 0.1 | ○ |
| Example 18 |  | (35000 Pa · s) | 0.75 | ○ |
| Example 19 |  |  | 1.5 | ○ |
| Example 20 |  |  | 3 | ○ |
| Example 21 | B | B | 0.1 | ○ |
| Example 22 |  | (3600 Pa · s) | 0.75 | ○ |
| Example 23 |  |  | 1.5 | ○ |
| Example 24 |  |  | 3 | ○ |
| Example 25 | B | C | 0.1 | ○ |
| Example 26 |  | (800 Pa · s) | 0.75 | ○ |
| Example 27 |  |  | 1.5 | ○ |
| Example 28 |  |  | 3 | ○ |
| Example 29 | B | D | 0.1 | ○ |
| Example 30 |  | (40 Pa · s) | 0.75 | ○ |
| Example 31 |  |  | 1.5 | ○ |
| Example 32 |  |  | 3 | ○ |

TABLE 5

| | | | | |
|---|---|---|---|---|
| Example 33 | C | A | 0.1 | ○ |
| Example 34 | | (35000 Pa·s) | 0.75 | ○ |
| Example 35 | | | 1.5 | ○ |
| Example 36 | | | 3 | ○ |
| Example 37 | C | B | 0.1 | ○ |
| Example 38 | | (3600 Pa·s) | 0.75 | ○ |
| Example 39 | | | 1.5 | ○ |
| Example 40 | | | 3 | ○ |
| Example 41 | C | C | 0.1 | ○ |
| Example 42 | | (800 Pa·s) | 0.75 | ○ |
| Example 43 | | | 1.5 | ○ |
| Example 44 | | | 3 | ○ |
| Example 45 | C | D | 0.1 | ○ |
| Example 46 | | (40 Pa·s) | 0.75 | ○ |
| Example 47 | | | 1.5 | ○ |
| Example 48 | | | 3 | ○ |
| Example 49 | D | A | 0.1 | ○ |
| Example 50 | | (35000 Pa·s) | 0.75 | ○ |
| Example 51 | | | 1.5 | ○ |
| Example 52 | | | 3 | ○ |
| Example 53 | D | B | 0.1 | ○ |
| Example 54 | | (3600 Pa·s) | 0.75 | ○ |
| Example 55 | | | 1.5 | ○ |
| Example 56 | | | 3 | ○ |
| Example 57 | D | C | 0.1 | ○ |
| Example 58 | | (800 Pa·s) | 0.75 | ○ |
| Example 59 | | | 1.5 | ○ |
| Example 60 | | | 3 | ○ |
| Example 61 | D | D | 0.1 | ○ |
| Example 62 | | (40 Pa·s) | 0.75 | ○ |
| Example 63 | | | 1.5 | ○ |
| Example 64 | | | 3 | ○ |

TABLE 6

| | | | | |
|---|---|---|---|---|
| Example 65 | E | A | 0.75 | ○ |
| Example 66 | | (35000 Pa·s) | 1.5 | ○ |
| Example 67 | | | 3 | ○ |
| Example 68 | E | B | 0.1 | ○ |
| Example 69 | | (3600 Pa·s) | 0.75 | ○ |
| Example 70 | | | 1.5 | ○ |
| Example 71 | | | 3 | ○ |
| Example 72 | E | C | 0.1 | ○ |
| Example 73 | | (800 Pa·s) | 0.75 | ○ |
| Example 74 | | | 1.5 | ○ |
| Example 75 | | | 3 | ○ |
| Example 76 | E | D | 0.1 | ○ |
| Example 77 | | (40 Pa·s) | 0.75 | ○ |
| Example 78 | | | 1.5 | ○ |
| Example 79 | | | 3 | ○ |

TABLE 6-continued

| | | | | |
|---|---|---|---|---|
| Example 80 | F | A | 0.1 | X |
| Example 81 | | (35000 Pa·s) | 0.75 | ○ |
| Example 82 | | | 1.5 | ○ |
| Example 83 | | | 3 | ○ |
| Example 84 | F | B | 0.1 | ○ |
| Example 85 | | (3600 Pa·s) | 0.75 | ○ |
| Example 86 | | | 1.5 | ○ |
| Example 87 | | | 3 | ○ |
| Example 88 | F | C | 0.1 | ○ |
| Example 89 | | (800 Pa·s) | 0.75 | ○ |
| Example 90 | | | 1.5 | ○ |
| Example 91 | | | 3 | ○ |
| Example 92 | F | D | 0.1 | ○ |
| Example 93 | | (40 Pa·s) | 0.75 | ○ |
| Example 94 | | | 1.5 | ○ |
| Example 95 | | | 3 | ○ |

DESCRIPTION OF REFERENCE SIGNS

40: Sealing sheet
50: Stacked body
53: Semiconductor chips
58: Sealed body
59: Semiconductor device
60: Temporary-fixation member

The invention claimed is:

1. A sealing sheet, having a viscosity at 90° C. that ranges from 1 to 50000 Pa·s, wherein when a sealing sheet piece obtained by cutting out the sealing sheet into a size of 22 cm in length×22 cm in width is put onto a chip-stacked glass carrier of 22 cm in length×22 cm in width, on which semiconductor chips each of 7 mm in length×7 mm in width×200 μm in thickness are mounted to have a chip-mounted interval (interval between edges of any adjacent two of the chips) of 3 mm, the number of the chips being 20 in each length direction line of the carrier and being 20 in each width direction line thereof, and then the resultant product is flat-plate-pressed at a pressing pressure of 1 MPa and a pressing temperature of 90° C. for a pressing period of 120 seconds, the ratio of a change in the dimension of the resultant product after the flat-plate pressing is 20% or less of the dimension of the resultant product which is not yet pressed before the flat-plate-pressing.

* * * * *

UNITED STATES PATENT AND TRADEMARK OFFICE
CERTIFICATE OF CORRECTION

PATENT NO. : 10,074,582 B2
APPLICATION NO. : 15/507923
DATED : September 11, 2018
INVENTOR(S) : Jun Ishii et al.

Page 1 of 1

It is certified that error appears in the above-identified patent and that said Letters Patent is hereby corrected as shown below:

In the Specification

Column 6, Line 5, Change "The" to --the--.

Column 10, Line 58, Change "Sheet," to --sheet,--.

Column 14, Line 63, Change "viscoelascity" to --viscoelasticity--.

Signed and Sealed this
Twenty-eighth Day of May, 2019

Andrei Iancu
*Director of the United States Patent and Trademark Office*